United States Patent [19]
Kim et al.

[11] Patent Number: 6,002,730
[45] Date of Patent: Dec. 14, 1999

[54] METHOD FOR DETECTING DATA AND DEVICE THEREFOR OF DATA STORING UNIT

[75] Inventors: Jin-sook Kim; Yung-soo Kim, both of Seoul; Sung-jin Kim, Suwon, all of Rep. of Korea

[73] Assignee: Samsung Electronics Co., Ltd., Kyungki-do, Rep. of Korea

[21] Appl. No.: 08/744,458

[22] Filed: Nov. 7, 1996

[30] Foreign Application Priority Data

Nov. 8, 1995 [KR] Rep. of Korea .................. 95-40258

[51] Int. Cl.⁶ ..................................... H04L 25/36
[52] U.S. Cl. .................. 375/371; 375/326; 375/340; 375/346
[58] Field of Search ......................... 375/226, 229, 375/254, 266, 278, 326, 340, 346, 371, 375; 329/307, 309, 310

[56] References Cited

U.S. PATENT DOCUMENTS

| | | | |
|---|---|---|---|
| 4,024,342 | 5/1977 | Croisier et al. | 375/235 |
| 5,546,132 | 8/1996 | Kim et al. | 375/346 |
| 5,602,583 | 2/1997 | Citta | 375/265 |
| 5,640,418 | 6/1997 | Tanaka | 375/232 |
| 5,760,984 | 6/1998 | Spurbeck et al. | 360/51 |

OTHER PUBLICATIONS

Cideciyan et al., "A PRML System for Digital Magnetic Recording" IEEE Journal on Selected Areas In Communication, vol. 10, No. 1, Jan. 1992.

*Primary Examiner*—Wellington Chin
*Assistant Examiner*—Congvan Tran
*Attorney, Agent, or Firm*—Leydig, Voit & Mayer, Ltd.

[57] ABSTRACT

A method and device for detecting data of a data storing unit includes an analog/digital converter for outputting a symbol signal $r_k$ by sampling an analog signal r(t) with a sampling clock, an equalizer for outputting $z_k$ by equalizing the output $r_k$ of the analog/digital converter, a data detector for detecting symbol data $â_k$ from the equalized output $z_k$, and a clock recovering portion for correcting frequency and phase of the sampling clock, the clock recovering portion performing the correction at an edge of a symbol data $â_k$. Therefore, it is possible to reduce errors in detecting data and to effectively detect the data with a far better performance that conventional technology and to restore a sampling clock by limiting a sampling clock recovering process to operate only at the edge of the symbol data.

16 Claims, 4 Drawing Sheets

METHOD FOR DETECTING DATA AND DEVICE THEREFOR OF DATA STORING UNIT

BACKGROUND OF THE INVENTION

The present invention relates to a method for detecting data recorded from a signal reproduced in a data storing unit and a device therefor, and more particularly, to a method for detecting data for recovering clock by limiting a sampling clock recovering process to operate only at an edge of a signal waveform in order to effectively detect the reproduced signal in case the recorded data is coded to a run length limited code whose runlength constraints are not less than one, and a device therefore Research and development for effectively using massive information in the modern information conscious society has been rapidly advancing. As a result, remarkable developments have been achieved in various fields. Also, as societal demand to use information increases, delievering large quantities of information and reducing time for processing information, and increaing quantity of data recorded in a storing unit of a given capacity (recording density) become the biggest object in the storing field unit. There are methods for improving physical characteristics of a storage disk or precision degree of the data storing unit and for reducing data detecting errors using a signal processing technique, which can be regarded as efforts to maximize a speed and a capacity of such a data storing unit.

The data recorded in such a storing unit is the data encoded to the RLL code. This is an encoding method for preventing data symbols to be recorded from being continuously connected, in order to control timing of data sampling clock and to detect a signal. Namely, this is a runlength (d, k) code which limits the number of "0s" which continue between "1" and "1" into d in the minimum and k in the maximum. The former is for facilitating the signal detection and the latter is for timing of the data in recovering the reproduced signal. Since the characteristics of the reproduced signal are different according to the position on the disk, it is necessary to appropriately change a signal detecting method or an equalizer according to the characteristics of the signal for precise signal detection. Also, frequency and phase of the clock should be continuously adjusted so that the sampling is performed in an accurate position of a pulse during a procedure of sampling an analog signal to a symbol signal.

While, in case of an optical magnetic disk storing unit, it is possible to record the data in high density when the data is coded to the RLL code whose minimum runlength d is not less than one, considering the characteristics of a laser and a disk medium for recording the data. In a magnetic storing unit such as a hard disk driver, since it is hard to detect the data due to a nonlinear characteristic of the signal as the recording density increases, the data may be coded to the RLL code whose runlength d is not less than one in order to reduce the nonlinearity of the signal.

Generally, a channel should be modeled similarly to a real channel during recording and reproducing with respect to a storing unit. Such a channel characteristic of the unit can be expressed as $(1+D)^n$ or $(1-D)(1+D)^n$, (here, n=1, 2, . . . ), according to a recording density in order to reflect the channel characteristic of the storing unit. Here, D denotes a time delay. Since interference between the recorded signals increases as the recording is performed in high density in the storing unit, the channel should be modeled with a larger n value to be expressed nearer to the real channel characteristic.

There are a decision feedback equalizer (DFE) method and a partial response maximum likelihood (PRML) method, etc, in recent data detecting methods. Among them, the DFE method is the method for changing an input signal to have only the present data value by equalizing it to a target response satisfying $d_k = \hat{a}_k$ and for detecting data with a normal threshold value detector. In the DFE method, it is easy to detect the data since the data is detected with the threshold detector and to control the sampling clock since the data is detected to every clock. However, in case signal interference is high, detecting performance is deteriorated since noise of a high frequency is amplified in the process of equalizing the input signal to meet $d_k = \hat{a}_k$. Meanwhile, in the PRML method, the data is detected with a Viterbi decoder by changing the input signal into a target response satisfying $d_k = \hat{a}_k + \hat{a}_{k-1}$ or $d_k = \hat{a}_k - \hat{a}_{k-2}$ after generating inter-symbol interference (ISI) controlled between the present data and the previous data by preceding the input signal. In the recording density which has the signal interference in which the channel characteristic approximately meets n=1, it is possible to excellently detecting the data using the PRML method, however, it is hard to control the sampling clock since the data is not detected every clock.

To restore the data recorded on the storing unit, the bit clock should be restored from a reproduce signal. Such a restoration of the bit clock is for generating the clock synchronized with the bit clock and sampling it and for continuously obtaining a sample of a desired accurate value by tracking the change of the bit clock frequency of the reproduced signal. In general bit clock recovering methods, there are a method for directly extracting the bit clock by passing the reproduced signal over a narrow-band band pass filter and sampling the reproduced signal using the bit clock and a method for obtaining a sampling phase error from the sampling value obtained by sampling the reproduced signal and gradually adjusting the frequency of the sampling clock by removing the sampling phase error.

The latter method is widely used in processing the reproduced signal of the storing unit. In the latter method, the phase error of the sampling clock is detected, the sampling error is adjusted again according to the error, and a series of sampling clock recovering processes are performed to all the data patterns. Recovering the clock by sampling it every time in such a method is inefficient since, when continuous data rows of the same value are repeated, continuous sampling clock restorations are performed in the data which does not have timing information.

SUMMARY OF THE INVENTION

It is an object of the present invention to provide a method for detecting data of a data storing unit for recovering clock by limiting a sampling clock recovering process to operate only at an edge of a signal waveform and an unit therefor in a system for equalizing a target response of the signal reproduced in the channel in which the data coded to the RLL(1, 7) code in which the runlength constraints are 1 in the minimum and 7 in the maximum is expressed PR II$[(1+D)^2]$ or extended PR4(EPR4)$[(1-D)(1+D)^2]$ to meet $d_k = \hat{a}_{k-1} + 2\hat{a}_k + \hat{a}_{k+1}$ and for detecting the data with a simplified threshold value detector.

To achieve the above object, there is provided a data detection apparatus, comprising an analog/digital converter for outputting a symbol signal $r_k$ by sampling a analog signal $r(t)$ to a sampling clock, an equalizer for outputting $z_k$ by equalizing the output $r_k$ of the analog/digital converter, a data detector for detecting a symbol data $\hat{a}_k$ from the equalized output $z_k$, and a clock recovering portion for correcting a frequency and a phase of the sampling clock, wherein the clock recovering portion performs the correction when an edge of a symbol data $â_k$ occurs.

Also, in a data detection apparatus, comprising an analog/digital converter for outputting a symbol signal $r_k$ by sampling a analog signal r(t) to a sampling clock, an equalizer for outputting $z_k$ by equalizing the output $r_k$ of the analog/digital converter, a data detector for detecting a symbol data $â_k$ from the equalized output $z_k$, and a clock recovering portion for correcting a frequency and a phase of the sampling clock, the clock recovering portion comprises a conditioning portion for outputting a control signal using the symbol signal $â_k$ as an input, a selecting portion for outputting a phase error $\Delta\tau_k$ using the equalized output $z_k$ and the control signal output from the conditioning portion, and an error correcting portion for outputting a timing error using the control signal output from the conditioning portion and the phase error $\Delta\tau_k$ from the selecting portion.

Also, in a data detection apparatus, comprising an analog/digital converter for outputting a symbol signal $r_k$ by sampling a analog signal r(t) to a sampling clock, an equalizer for outputting $z_k$ by equalizing the output $r_k$ of the analog/digital converter, a data detector for detecting a symbol data $â_k$ from the equalized output $z_k$, an error calculating portion for calculating equalizer output error $e_k$ using the equalized output $z_k$ and the symbol signal $â_k$, and a clock recovering portion for correcting a frequency and a phase of the sampling clock, the clock recovering portion comprises a conditioning portion for outputting a control signal using the symbol signal $â_k$ as an input, a selecting portion for outputting a phase error $\Delta\tau_k$ using the equalized output $e_k$ and the control signal output from the conditioning portion, and an error correcting portion for outputting a timing error using the control signal output from the conditioning portion and the phase error $\Delta\tau_k$ from the selecting portion.

Also, a clock recovering method of a data detection apparatus which comprises an analog/digital converter for outputting a symbol signal $r_k$ by sampling an analog signal r(t) to a sampling clock, an equalizer for outputting $z_k$ by equalizing the output $r_k$ of the analog/digital converter, a data detector for detecting a symbol data $â_k$ from the equalized output $z_k$, and a clock recovering portion for correcting a frequency and a phase of the sampling clock comprises a determining step for determining a control signal using the symbol data $â_k$ as an input, an error calculating step for calculating a phase error $\Delta\tau_k$ using the equalized output $z_k$ and the control signal output from the determining step, and an error correcting step for calculating a timing error using the control signal output from the determining step and the phase error $\Delta\tau_k$ output from the error calculating step.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
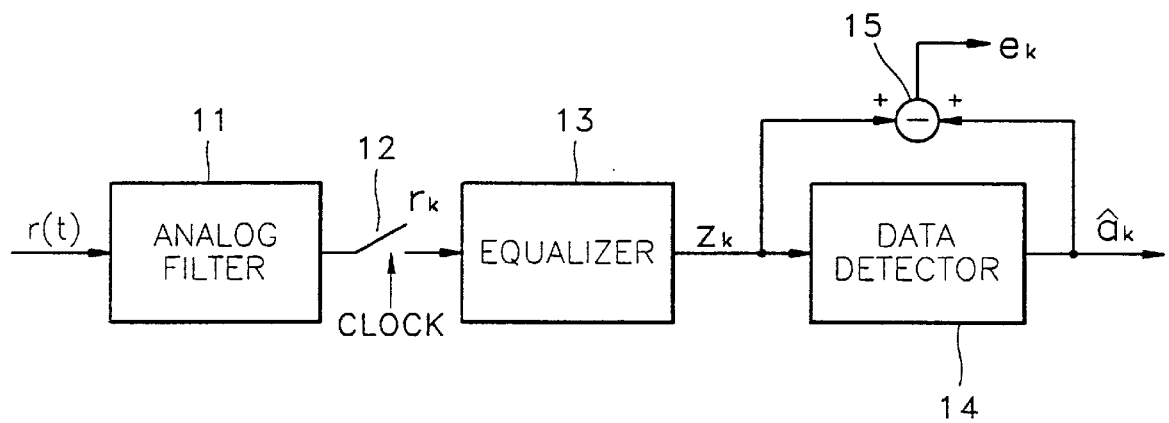
FIGS. 1A and 1B are block diagrams showing a data detection apparatus in a storing unit according to the present invention.

Hereinafter, a preferred embodiment of the present invention is described in detail with reference to the attached drawings.

FIGS. 1A and 1B are block diagrams showing a data detection apparatus according to the present invention.

First, FIG. 1A which is an embodiment of the present invention includes an analog filter 11, an analog/digital converter 12, an equalizer 13, a data detector 14 and a clock recovering portion 15. Also, FIG. 1B which is another embodiment of the present invention includes an analog filter 11, an analog/digital converter 12, an equalizer 13, a data detector 14, a clock recovering portion 15 and an error calculating portion 16.

Figure 2:
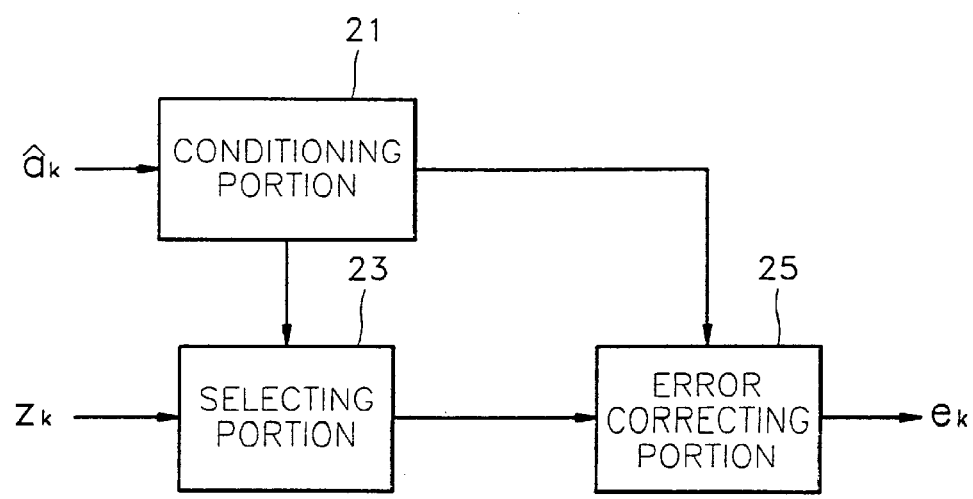
FIG. 2 is a block diagram showing a clock recovering device in FIGS. 1A and 1B.

FIG. 2 is a block diagram showing a clock recovering unit 15 according to the present invention shown in FIGS. 1A and 1B, which includes a conditioning portion 21 for outputting a predetermined control signal by receiving symbol data $â_k$ as an input, a selecting portion 23 for counting and outputting a series of phase errors $\Delta\tau_k$ which can be generated in constant time k by receiving the output of the equalizer 13 or the output $e_k$ of the error calculating portion 16 and the predetermined control signal output from the conditioning portion 21, and an error correcting portion 25 for outputting a timing error $\Delta T_{k+1}$ by receiving a predetermined control signal output from the conditioning portion 21 and the phase error $\Delta\tau_k$ output from the selecting portion 23.

FIGS. 3A to 3E are block diagrams showing first to fifth embodiments of the conditioning poriton 21 shown in FIG. 2.

Figure 3A:
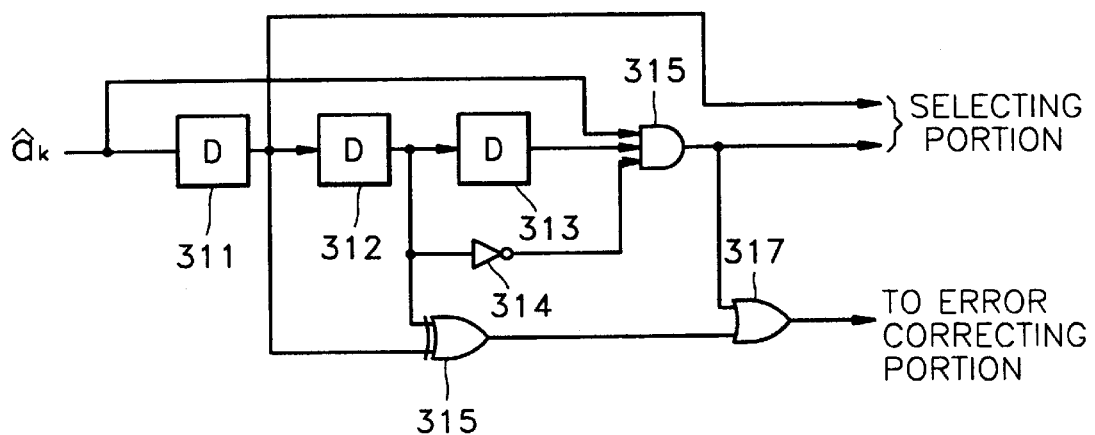
FIGS. 3A–3E are block diagrams showing first to fourth embodiments of a conditioning portion shown in FIG. 2.

The first embodiment of the conditioning portion 21 shown in FIG. 3A which realizes the following formulas 4 and 5 includes three D flip-flops 311, 312 and 313 each of which is a one-clock delay, an inverter 314, an AND gate 315, an exclusive OR gate 316, and an OR gate 317.

The second embodiment of the conditioning portion 21 shown in FIG. 3B which is realized using "if $â_{k+1}=â_{k-2}=-â_k$" instead of "if $â_{k-1}=â_{k-2}$ and $â_{k-1}\neq â_{k-2}$" in the following formula 5 includes three D flip-flops 321, 322 and 323, an inverter 324, an AND gate 325, an exclusive OR gate 326, and an OR gate 327.

The third embodiment of the conditioning portion 21 shown in FIG. 3C which is realized using "if $â_{k+1}-â_{k-2}=-â_k$" instead of "if $â_{k-1}=â_{k-2}$ and $â_{k-1}\neq â_{k-2}$" in the following formula 5 includes two D flip-flops 331 and 332, two inverters 333 and 334, an AND gate 335, an exclusive OR gate 336, and an OR gate 337.

Figure 3B:
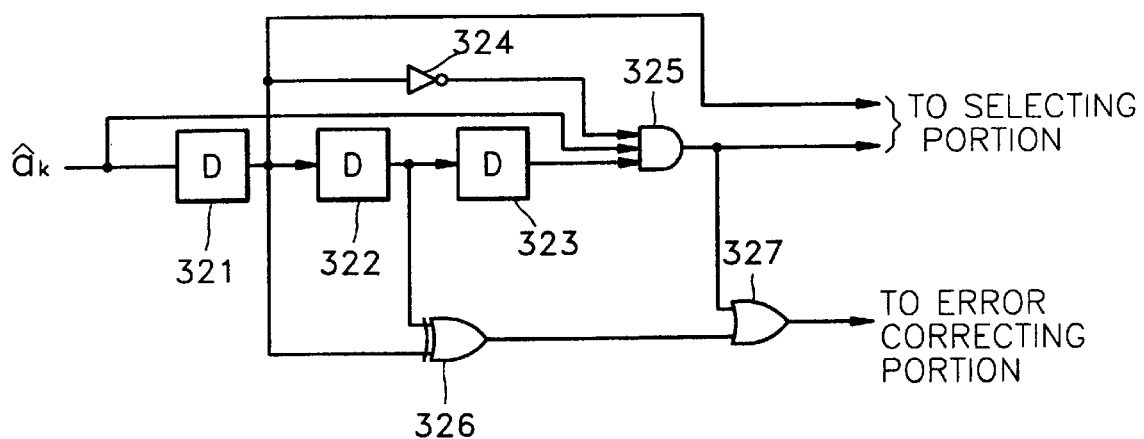
Figure 3C:
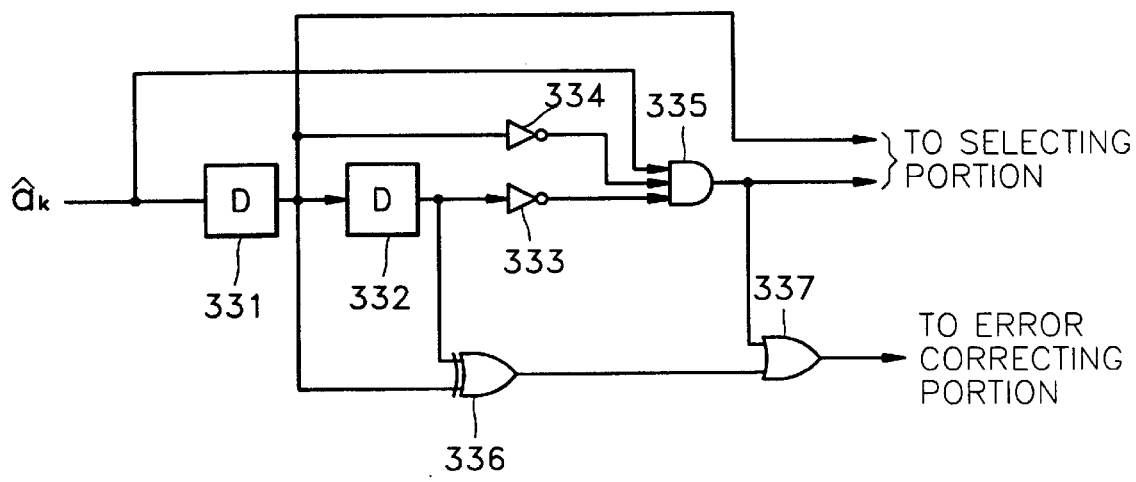
Figure 3D:
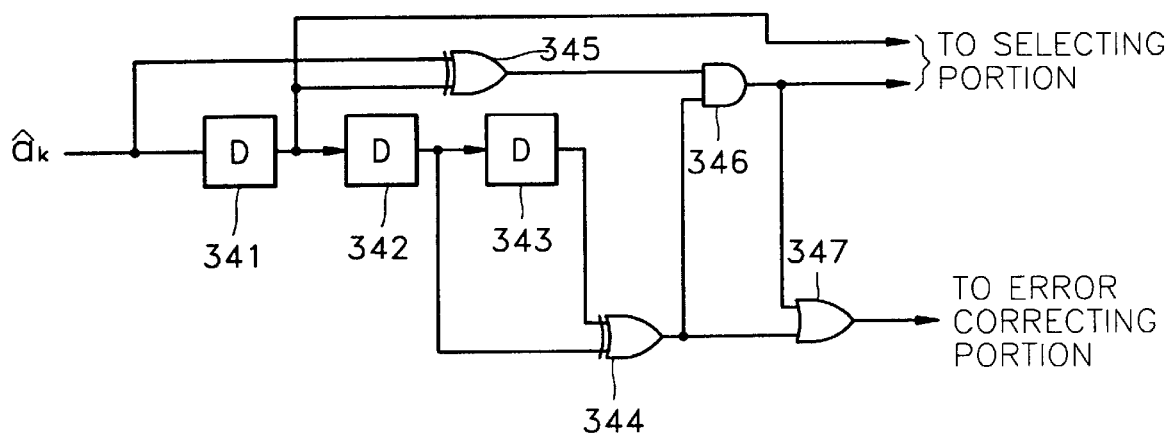

The fourth embodiment of the conditioning portion 21 shown in FIG. 3D includes three D flip-flops 341, 342 and 343, two exclusive OR gates 344 and 345, an AND gate 346 and an OR gate 347.

Figure 3E:
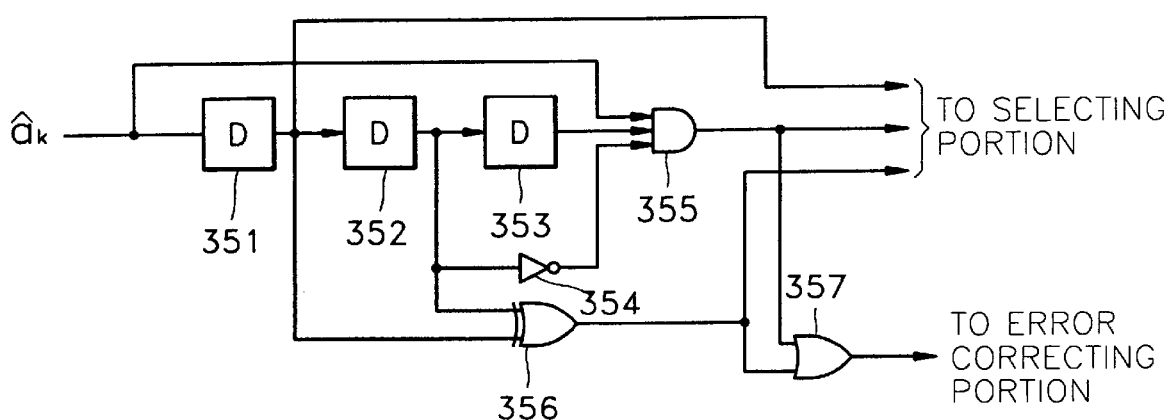

The fifth embodiment of the conditioning portion 21 shown in FIG. 3E includes three D flip-flops 351, 352 and 352, an inverter 354, an AND gate 355, an exclusive OR gate 356, and an OR gate 357.

Figure 4A:
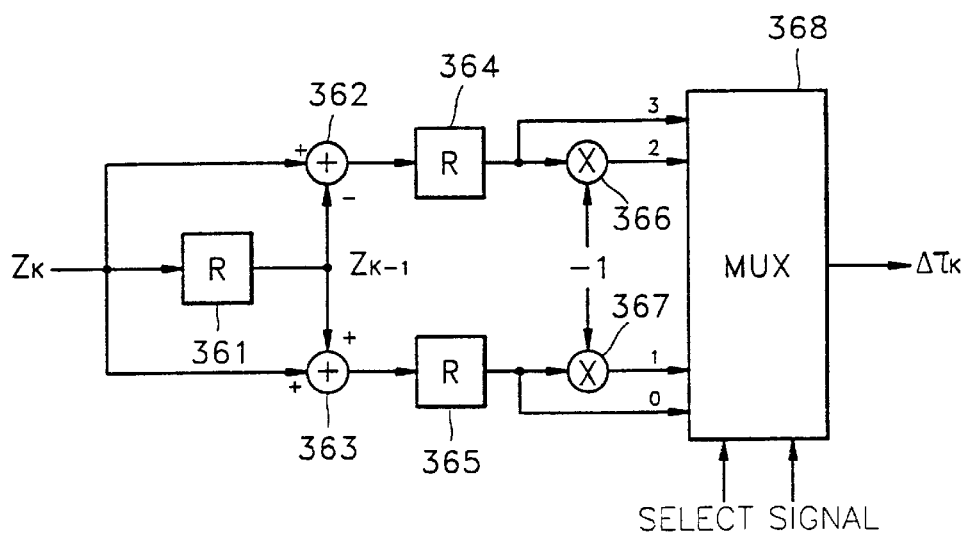
FIGS. 4A and 4B are block diagrams showing first and second embodiments of a selecting portion shown in FIG. 2.
Figure 4B:
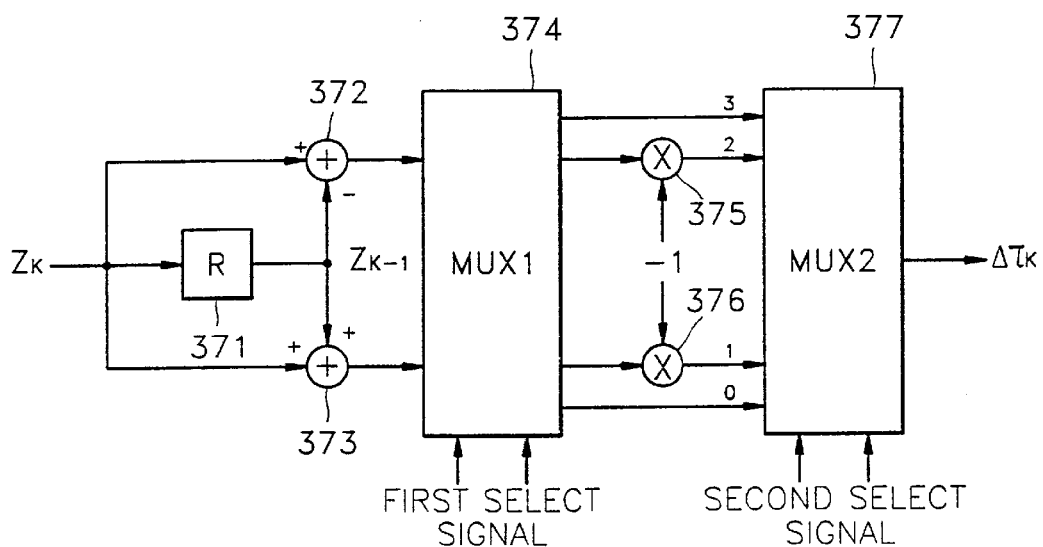

FIGS. 4A and 4B are block diagrams showing the first and second embodiments of the selecting portion 23 shown in FIG. 2.

The first embodiment of the selecting portion 23 shown in FIG. 4A includes three registers 361, 364 and 365, a subtractor 362, an adder 363, two multipliers 366 and 367, and a multiplexer 368.

The second embodiment of the selecting portion 23 shown in FIG. 4B includes a register 371, a subtractor 372, an adder 373, two multiplexers 374 and 377, and two multipliers 375 and 376.

Figure 5:
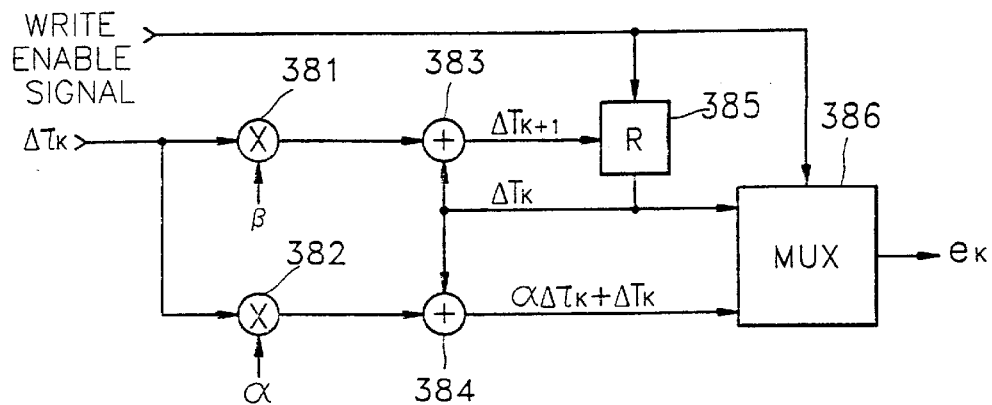
FIG. 5 is a block diagram showing an embodiment of an error correcting portion shown in FIG. 2.

FIG. 5 is a block diagram showing an embodiment of the error correcting portion 25 shown in FIG. 2 and includes two multipliers 381 and 382, two adders 383 and 384, a register 385, and a multiplexer 386.

The operation and the effect of the present invention will be described with reference to FIGS. 1 to 5.

In FIG. 1, since a signal r(t) which is reproduced from the storing unit is an analog signal including noise, the high frequency noise is removed in the analog filter 11. In the analog/digital converter 12, the output signal of the analog filter 11 is sampled to a symbol signal $r_k$ according to a given clock. The equalizer 13 generally includes a linear transversal filter (LTF) or the (DFE) and outputs $z_k$ by receiving the symbol signal $r_k$ output from the analog/digital converter 12 and changing it to fit for detecting the data. In the data detector 14, $â_k$ is output by deciding the symbol data $z_k$ changed in the equalizer 13 with a simple threshold detector and detecting the data. In the clock recovering portion 15, the output error $e_k$ of the equalizer 13 is detected using the output signal $z_k$ of the equalizer 13 and the output signal $â_k$ of the data detector 14. At this time, the output error $e_k$ of the equalizer 13 can be obtained as the following formula 1.

$$e_k = z_k - d_k \qquad (1)$$

In the formula 1, $d_k = â_{k-1} + 2â_k + â_{k+1}$. At this time, the error $e_k$ is obtained using the known data $â_k$ while training the equalizer 13 and the detected data $â_k$ is used in detecting the actual data, namely, in a decision directed mode. Since data $â_{k+1}$ which is not detected yet is included in the above formula 1, the error $e_{k-1}$ is actually obtained in time k. The tap value of the equalizer 13 is adaptively updated to a general LMS algorithm using the error $e_{k-1}$ and $z_k$ and $â_k$ which are the inputs of the clock recovering portion 15.

A general clock recovering process can be expressed as the following formulas 2 and 3.

$$\tau_{k+1} = \tau_k + \alpha \Delta \tau_k + \Delta T_k$$

$$\Delta T_{k+1} = \Delta T_k + \beta \Delta \tau_k \qquad (2)$$

$$\Delta \tau_k = -z_k d_{k-1} + z_{k-1} d_k \qquad (3)$$

It is noted from the above formulas 2 and 3 that the general clock recovering process is applied to all the data patterns, however, the value which is essential to the clock restoration is obtained at the edge of the signal waveform. Therefore, such a clock recovering process is limited to operate only at the edge of the signal waveform in the present invention, which can be expressed as the following formulas 4 and 5 using the above formulas 2 and 3.

$$\Delta \tau_k = (z_k + z_{k-1}) â_k, \text{ if } â_k \neq â_{k-1} \qquad (4)$$

$$\Delta \tau_k = -(z_k - z_{k-1}) â_k, \text{ if } â_{k-1} = â_{k-2} \text{ and } â_{k-1} \neq â_{k-2} \qquad (5)$$

$$\Delta \tau_k = 0, \text{ otherwise}$$

The above formulas 2 to 5 show a method for recovering the clock using the outputs $z_k$ and $â_k$ of the equalizer 13.

The present invention relates to a clock recovering method for recovering the data in which the input of the storing unit is RLL (1, 7) coded. The above formula 5 can be shown in another way in terms of the characteristic of the data.

FIG. 2 is a block diagram showing a clock recovering process for recovering the data in which the input of the storing unit is RLL (1, 7) coded. The respective components, i.e., the conditioning portion 21, the selecting portion 23 and the error correcting portion 25 are described as follows with reference to FIGS. 3 and 5.

First, the conditioning portion 21 shown in FIG. 2 is described as follows with reference to FIGS. 3A to 3E.

In the conditioning portion 21 of FIG. 2 shown in FIG. 3A, the AND gate 315 performs a AND operation of the data $â_k$ decided in the data detector 14, the output after the decided data passes through the three D flip-flops 311, 312 and 313, and the output after the output of the D flip-flop 312 passes through the inverter 314. The output of the AND gate 315 shows the condition $â_{k-1} = â_{k-2}$ and $â_{k-1} \neq â_{k-2}$ in the above formula 5 and is applied to a select signal of the multiplexer 368 of the selecting portion 23 of FIG. 2 shown in FIG. 4A together with the data $â_k$ decided in the data detector 14.

The output signals of the D flip-flops 311 and 312 undergo the exclusive OR in the exclusive OR gate 316 to then be applied to the OR gate 317. The output signal of the exclusive OR gate 316 and the output signal of the AND gate 315 undergo the OR in the OR gate 317 and are output as a write enable signal of the error correcting portion 25 of FIG. 2 shown in FIG. 5. The output value of the OR gate 317 enables to select one of the case of the above formula 4 or 5 and the other case satisfying $\Delta \tau_k = 0$. The selected output value determines whether the register 385 will correct the $\Delta T_k$ value in the error correcting portion 25 of FIG. 2 or not.

Then, in the conditioning portion 21 of FIG. 2 shown in FIG. 3B, the AND gate 325 performs an AND operation of the data $â_k$ decided in the data detector 14, the output after the decided data passes through the three D flip-flops 321, 322 and 323, and the output after the output of the D flip-flop 321 passes through the inverter 324. The output of the AND gate 325 is applied to the select signal of the multiplexer 368 of the selecting portion 23 of FIG. 2 shown in FIG. 4A together with the data $â_k$ decided in the data detector 14.

The output signals of the D flip-flops 321 and 322 undergo the exclusive OR in the exclusive OR gate 326 to then be applied to the OR gate. The output signal of the exclusive OR gate 326 and the output signal of the AND gate 325 undergo the OR in the OR gate 327 and are output as a write enable signal of the error correcting portion 25 of FIG. 2 shown in FIG. 5. The output value of the OR gate 327 enables to select one of the case of the above formula 4 or 5 and the other case satisfying $\Delta \tau_k = 0$. The selected output value determines whether the register 385 will correct the $\Delta T_k$ value in the error correcting portion 25 of FIG. 2 or not.

In the conditioning portion 21 of FIG. 2 shown in FIG. 3C, the AND gate 335 performs an AND operation of the data $â_k$ decided in the data detector 14, the output after the decided data passes through the two D flip-flops 331 and 332 and the inverter 334, and the output after the output of the D flip-flop 331 passes through the inverter 334. The output of the AND gate 335 is applied to the select signal of the multiplexer 368 of the selecting portion 23 of FIG. 2 shown in FIG. 4A together with the data $â_k$ decided in the data detector 14.

The output signals of the D flip-flops 331 and 332 undergoes the exclusive OR in the exclusive OR gate 336 to then be applied to the OR gate 337. The output signal of the exclusive OR gate 336 and the output signal of the AND gate 335 undergo the OR in the OR gate 337 and are output as a write enable signal of the error correcting portion 25 of FIG. 2 shown in FIG. 5. The output value of the OR gate 337 enables to select one of the case of the above formula 4 or 5 and the other case satisfying $\Delta\tau_k=0$. The selected output value determines whether the register 385 will correct the $\Delta T_k$ value in the error correcting portion 25 of FIG. 2 or not.

In the conditioning portion 21 of FIG. 2 shown in FIG. 3D, the exclusive OR gate 344 performs an exclusive OR operation of the output after the data $\hat{a}_k$ decided in the data detector 14 passes through the three D flip-flops 341, 342 and 343 and the output of the D flip-flop 342. The exclusive OR gate 345 performs an exclusive OR operation of the output after the data $\hat{a}_k$ decided in the data detector 14 passes through the three D flip-flop 341. The output signal of the exclusive OR gate 344 and the output of the exclusive OR gate 345 undergo the AND in the AND gate 346 and are applied as the select signal of the multiplexer 368 of the selecting portion 23 of FIG. 2 shown in FIG. 4A together with the data $\hat{a}_k$ decided in the data detector 14.

The output of the exclusive OR gate 344 and that of the AND gate 346 undergo the OR in the OR gate 347 and are output as a write enable signal of the error correcting portion 25 of FIG. 2 shown in FIG. 5. The output value of the OR gate 347 enables to select one of the case of the above formula 4 or 5 and the other case satisfying $\Delta\tau_k=0$. The selected output value determines whether the register 385 will correct the $\Delta T_k$ value in the error correcting portion 25 of FIG. 2 or not.

Then, in the conditioning portion 21 of FIG. 2 shown in FIG. 3E, the AND gate 355 performs an AND operation of the data $\hat{a}_k$ decided in the data detector 14, the output after the decided data passes through the three D flip-flops 351, 352 and 353, and the output after the output of the D flip-flop 352 passes through the inverter 354. The output of the AND gate 355 is applied as a second select signal of the multiplexer 377 MUX2 of the selecting portion 23 of FIG. 2 shown in FIG. 4B together with the output of the following exclusive OR gate 356. The data $\hat{a}_k$ decided in the data detector 14 delayed in the D flip-flop 351 is applied as a first select signal of the multiplexer 374 MUX1 of the selecting portion 23 of FIG. 2 shown in FIG. 4B.

The output signals of the D flip-flops 351 and 352 undergoes the exclusive OR in the exclusive OR gate 356 to then be applied to the OR gate 357. The output signal of the exclusive OR gate 356 and that of the AND gate 335 undergo the OR in the OR gate 357 and are output as a write enable signal of the error correcting portion 25 of FIG. 2 shown in FIG. 5. The output value of the OR gate 357 enables selection of one of the case of the above formula 4 or 5 and the other case satisfying $\Delta\tau_k=0$. The selected output value determines whether the register 385 will correct the $\Delta T_k$ value in the error correcting portion 25 of FIG. 2 or not.

Then, the selecting portion 23 shown in FIG. 2 will be described with respect to FIGS. 4A and 4B.

In the selecting portion 23 of FIG. 2 shown in FIG. 4A, the output $z_k$ (in case of FIG. 1A) of the equalizer 11 or that $e_k$ (in case of FIG. 1B) of the error calculating portion 16 are input respectively to the register 361, the subtractor 362 and the adder 363, $z_k-z_{k-1}$ (or $e_k-e_{k-1}$) is output to the register 364 from the subtractor 362, and $z_k+z_{k+1}$ (or $e_k+e_{k-1}$) is output to the register 365 from the adder 363.

The output signals $z_k-z_{k-1}$ (or $e_k-e_{k-1}$) and $z_k+z_{k+1}$ (or $e_k+e_{k-1}$) of the registers 364 and 365 are respectively input to the multiplexer 368 and the multipliers 366 and 367 in which the output signals of the registers 364 and 365 are inversed by multiplying −1 thereby and −($z_k-z_{k-1}$) [or −($e_k-e_{k-1}$)] and −($z_k+z_{k-1}$) [or −($e_k+e_{k-1}$)] are applied to the multiplexer 368.

The multiplexer 368 selects one among $z_k-z_{k-1}$ (or $e_k-e_{k-1}$), −($z_k-z_{k-1}$) [or −($e_k-e_{k-1}$)], $z_k+z_{k-1}$ (or $e_k+e_{k-1}$), −($z_k+z_{k-1}$) [or −($e_k+e_{k-1}$)] by receiving the signal output from the conditioning portion 21 shown in FIGS. 3A to 3D as the select signal and outputs it as the phase error $\Delta\tau_k$. At this time, the select signals output from the AND gates 315 of FIG. 3A, 325 of FIG. 3B, 235 of FIG. 3C, and 346 of FIG. 3D of the conditioning portion 21 of FIG. 2 select one among the output signals $z_k-z_{k-1}$ (or $e_k-e_{k-1}$) and $z_k+z_{k-1}$ (or $e_k+e_{k-1}$) of the registers 364 and 365 and the $\hat{a}_k$ output from the D flip-flops 311 of FIG. 3A, 321 of FIG. 3B, 331 of FIG. 3C, and 341 of FIG. 3D of the conditioning portion 21 of FIG. 2 determines the sign of the results decided in the AND gates 315 of FIG. 3A, 325 of FIG. 3B, 335 of FIG. 3C, and 346 of FIG. 3D.

Then, in the selecting portion 23 of FIG. 2 shown in FIG. 4B, the output $z_k$ (in case of FIG. 1A) of the equalizer 11 or that $e_k$ (in case of FIG. 1B) of the error calculating portion 16 are respectively input to the register 371, the subtracter 372, and the adder 373, the $z_k-z_{k-1}$ (or $e_k-e_{k-1}$) is output to the multiplexer 374 MUX1 in the subtracter 372, and the $z_k+z_{k-1}$ (or $e_k+e_{k-1}$) is output to the multiplexer 374 in the adder 373. In the multiplexer 374, the one selected between $z_k-z_{k-1}$ (or $e_k-e_{k-1}$) and $z_k+z_{k-1}$ (or $e_k+e_{k-1}$) is output by receiving the data $\hat{a}_k$ decided in the data detector 14 delayed in the D flip-flop 351 of the conditioning portion 21 of FIG. 2 shown in FIG. 3E as a first select signal.

The signals $z_k-z_{k-1}$ (or $e_k-e_{k-1}$) and $z_k+z_{k-1}$ (or $e_k+e_{k-1}$) output from the multiplexer 374 and the signals −($z_k-z_{k-1}$) [or −($e_k-e_{k-1}$)] and −($z_k+z_{k-1}$) [or −($e_k+e_{k-1}$)] obtained by inversing the signals multiplied by −1 in the multipliers 375 and 376 and output from the multiplexer 374 are applied to the multiplexer 377 (MUX 2).

The multiplexer 377 selects one among $z_k-z_{k-1}$ (or $e_k-e_{k-1}$), $z_k+z_{k-1}$ (or $e_k+e_{k-1}$), −($z_k-z_{k-1}$) [or −($e_k-e_{k-1}$)] and −($z_k+z_{k-1}$) [or −($e_k+e_{k-1}$)] by receiving the signal output from the AND gate 355 and the exclusive OR gate 356 of the conditioning portion 21 shown in FIG. 3E as a select signal and outputs it as the phase error $\Delta\tau_k$.

Namely, in FIGS. 4A and 4B, the phase error $\Delta\tau_k$ is decided as $(z_k+z_{k-1})\hat{a}_k$ [or $(e_k+e_{k-1})\hat{a}_k$] in case the symbol data detected in the data detector 14 meets $\hat{a}_k \neq \hat{a}_{k-1}$, the phase error $\Delta\tau_k$ is decided as −$(z_k-z_{k-1})\hat{a}_k$ [or −$(e_k-e_{k-1})\hat{a}_k$] in case the detected symbol data meets $\hat{a}_{k+1}=\hat{a}_{k-2}$, $\hat{a}_k=\hat{a}_{k-1}$ and $\hat{a}_{k-1} \neq \hat{a}_{k-2}$ and the phase error $\Delta\tau_k$ is decided as 0 in case the detected symbol data belongs to the other case.

Then, the error correcting portion 25 of FIG. 2 is described in detail with respect to FIG. 5.

In the error correcting portion 25 shown in FIG. 5, the phase errors $\Delta\tau_k$ output from the selecting portion 23 of FIG. 2 are respectively input to the multipliers 381 and 382. In the multiplier 381, $\beta\Delta\tau_k$ obtained by multiplying a predetermined value $\beta$ by the $\Delta\tau_k$ is output to the adder 383. In the adder 383, $\Delta T_{k+1}=\Delta T_k+\beta\Delta\tau_k$ is output by adding the output $\beta\Delta\tau_k$ of the multiplier 381 to that $\Delta T_k$ of the register 385.

In the multiplier 382, $\alpha\Delta\tau_k$ is output to the adder 384 by multiplying a predetermined value $\alpha$ by $\Delta\tau_k$. In the adder 384, $\Delta T_k+\alpha\Delta\tau_k$ is output by adding the output $\alpha\Delta\tau_k$ of the multiplier 382 and that $\Delta T_k$ of the register 385.

The multiplexer 386 outputs the timing error value $e_k$ according to the case of the above formulas 4 and 5 and that of the other case satisfying $\Delta\tau_k=0$ at one between $\Delta T_k$ and $\Delta T_{k+1}=\Delta T_k+\beta\Delta\tau_k$ according to the write enable signal output from the conditioning portion 21 shown in FIGS. 3A to 3E.

As described above, in the method for recovering clock and the device therefor according to the present invention in the data storing unit, it is possible to reduce detecting errors during detecting the data and to effectively detect the data with far better detecting performance than that of the conventional technology, so as to restore the clock by limiting the sampling clock recovering process to operate only at the edge of the signal in the system for equalizing a target response of the signal reproduced in the channel in which the data coded to the RLL(1, 7) code in which the runlength constraints are 1 in the minimum and 7 in the maximum is expressed PR II[$(1+D)^2$] or extended PR4(EPR4)[$(1-D)(1+D)^2$] to meet $d_k = â_{k-1} + 2â_k + â_{k+1}$ and for detecting the data with a simplified threshold value detector.

What is claimed is:

1. A data detection apparatus comprising:
   an analog/digital converter outputting a symbol signal $r_k$ by sampling a run length limited coded analog signal r(t), having a maximum run length k, with a sampling clock;
   an equalizer outputting $z_k$ by equalizing the output $r_k$ of said analog/digital converter;
   a data detector detecting symbol data $â_k$ from the equalized output $z_k$; and
   a clock recovering portion correcting frequency and phase of the sampling clock, wherein said clock recovering portion comprises:
      a conditioning portion outputting a control signal using the symbol data $â_k$ as an input;
      a selecting portion outputting a phase error $\Delta\tau_k$ using the equalized output $z_k$ and the control signal output by said conditioning portion; and
      an error correction portion outputting a timing error using the control signal output by said conditioning portion and the phase error $\Delta\tau_k$ from said selecting portion.

2. A data detection apparatus comprising:
   an analog/digital converter outputting a symbol signal $r_k$ by sampling a run length limited coded analog signal r(t), having a maximum run length k, with a sampling clock;
   an equalizer outputting $z_k$ by equalizing the output $r_k$ of said analog/digital converter;
   a data detector detecting symbol data $â_k$ from the equalized output $z_k$;
   an error calculating portion calculating equalizer output error $e_k$ using the equalized output $z_k$ and the symbol signal $â_k$; and
   a clock recovering portion correcting frequency and phase of the sampling clock, wherein said clock recovering portion comprises:
      a conditioning portion outputting a control signal using the symbol data $â_k$ as an input;
      a selecting portion outputting a phase error $\Delta\tau_k$ using the equalizer output error $e_k$ and the control signal output by said conditioning portion; and
      an error correction portion outputting a timing error using the control signal output by said conditioning portion and the phase error $\Delta\tau_k$ from said selecting portion.

3. The data detection apparatus as claimed in claim 1, wherein said conditioning portion comprises:
   first, second, and third delaying devices respectively outputting signals $â_{k-1}$, $â_{k-2}$, and $â_{k-3}$ delayed by one clock pulse, two clock pulses, and three clock pulses from the symbol data $â_k$ from said data detector;
   an inverter inverting the signal $â_{k-2}$ output by said second delaying device;
   an AND gate outputting '1' when $â_k = â_{k-3} = -â_{k-2}$ and outputting '0' otherwise, in response to the symbol data $â_k$ from said data detector, $â_{k-3}$ from said third delaying device, and $-â_{k-2}$ from said inverter;
   an exclusive OR gate outputting '1' when $â_{k-1}$ from said first delaying device and $â_{k-2}$ from said second delaying device are not identical and outputting '0' when they are identical; and
   an OR gate outputting '1' when $â_{k-1} \neq â_{k-2}$ or $â_k = â_{k-3} = -â_{k-2}$ and outputting '0' otherwise, in response to the output of said exclusive OR gate and the output of said AND gate.

4. The data detection apparatus as claimed in claim 1, wherein said conditioning portion comprises:
   first, second, and third delaying devices respectively outputting signals $â_{k-1}$, $â_{k-2}$, and $â_{k-3}$ delayed by one clock pulse, two clock pulses, and three clock pulses from the symbol data $â_k$ from said data detector;
   an inverter inverting the signal $â_{k-1}$ output by said first delaying device;
   an AND gate outputting '1' when $â_k = â_{k-3} = -â_{k-1}$ and outputting '0' otherwise, in response to the symbol data $â_k$ from said data detector, $â_{k-3}$ from said third delaying device, and $-â_{k-1}$ from said inverter;
   an exclusive OR gate outputting '1' when $â_{k-1}$ output by said first delaying device and $â_{k-2}$ from said second delaying device are not identical and outputting '0' when they are identical; and
   an OR gate outputting '1' when $â_{k-1} \neq â_{k-2}$ or $â_k = â_{k-3} = -â_{k-1}$ and outputting '0' otherwise, in response to the output of said exclusive OR gate and the output of said AND gate.

5. The data detection apparatus as claimed in claim 1, wherein said conditioning portion comprises:
   first and second delaying devices respectively outputting signals $â_{k-1}$ and $â_{k-2}$ delayed by one clock pulse and two clock pulses from the symbol data $â_k$ from said data detector;
   first and second inverters respectively inverting the $â_{k-1}$ output and the $â_{k-2}$ output by said first and second delaying devices;
   an AND gate outputting '1' when $â_k = â_{k-1} = -â_{k-2}$ and outputting '0', otherwise, in response to the symbol data $â_k$ from said data detector and $-â_{k-1}$ and $-â_{k-2}$ from said first and second inverters;
   an exclusive OR gate outputting '1' when $â_k$ output by said first delaying device and $â_{k-2}$ from said second delaying device are not identical and outputting '0' when they are identical; and
   an OR gate outputting '1' when $â_{k-1} \neq â_{k-2}$ or $â_k = -â_{k-1} = -â_{k-2}$ and outputting '0' otherwise, in response to the output of said exclusive OR gate and the output of said AND gate.

6. The data detection apparatus as claimed in claim 1, wherein said conditioning portion comprises:
   first, second, and third delaying devices respectively outputting signals $â_{k-1}$, $â_{k-2}$, and $â_{k-3}$ delayed by one clock pulse, two clock pulses, and three clock pulses from the symbol data $â_k$ from said data detector;
   a first exclusive OR gate for outputting '1' when the symbol data $â_k$ from said data detector and $â_{k-1}$ from said first delaying device are not identical and outputting '0' when they are identical;
   a second exclusive OR gate for outputting '1' when $â_{k-2}$ from said second delaying device and $â_{k-3}$ from said third delaying device are not identical and outputting '0' when they are identical;

an AND gate outputting '1' when $â_k=â_{k-1}$ and $â_{k-2}≠â_{k-3}$ and outputting '0' otherwise, in response to the output of said first exclusive OR gate and the output of said second exclusive OR gate;

an OR gate outputting '1' when $â_{k-2}≠â_{k-3}$ or $â_k≠â_{k-1}$ and $â_{k-2}≠â_{k-3}$ and outputting '0' otherwise, in response to the output of said second exclusive OR gate and the output of said AND gate.

7. The data detection apparatus as claimed in claim 1, wherein said conditioning portion comprises:

first, second and third delaying devices respectively outputting signals $â_{k-1}$, $â_{k-2}$, and $â_{k-3}$ delayed by one clock pulse, two clock pulses, and three clock pulses from the symbol data $â_k$ from said data detector;

an inverter inverting the signal $â_{k-2}$ output by said second delaying device;

an exclusive OR gate outputting '1' when $â_{k-1}$ from said first delaying device and $â_{k-2}$ from said second delaying device are not identical and outputting '0' when they are identical;

an AND gate outputting '1' when $â_k=â_{k-3}=-â_{k-2}$ and outputting '0' otherwise, in response to the symbol data $â_k$ from said data detector, $â_{k-3}$ from said third delaying device, and $-â_{k-2}$ from said inverter; and an OR gate outputting '1' when $â_{k-1}≠â_{k-2}$ or $â_k=â_{k-3}=-â_{k-2}$ and outputting '0' otherwise, in response to the output of said exclusive OR gate and the output of said AND gate.

8. The data detection apparatus as claimed in claim 1, wherein said selecting portion comprises:

a first register outputting a signal $z_{k-1}$ delayed by one clock pulse from the output $z_k$ of said equalizer;

a subtractor subtracting $z_{k-1}$ from $z_k$;

a first adder adding $z_{k-1}$, and $z_k$;

second and third registers respectively outputting output by said subtractor and said adder;

first and second multipliers respectively inverting the outputs of said second and third registers; and a first multiplexer selecting the outputs of said second and third registers and the outputs of said first and second multipliers according to the output of said conditioning portion and outputting the phase error $Δτ_k$.

9. The data detection apparatus as claimed in claim 1, wherein said error correcting portion comprises:

a third multiplier multiplying a coefficient α by the phase error $Δτ_k$ output by said selecting portion;

a fourth multiplier multiplying a coefficient α by the phase error $Δτ_k$ output by said selecting portion;

a fourth register outputting $Δτ_k$ delayed by one clock pulse in response to a write enable signal output by said conditioning portion and receiving $Δτ_{k+1}$ as an input;

a second adder adding the output of said third multiplier and the output of said fourth register;

a third adder adding the output of said fourth multiplier and the output of said fourth register; and a second multiplexer selectively outputting the output of said fourth register and that of said third adder as the timing error, in response to the write enable signal output by said conditioning portion.

10. The data detection apparatus as claimed in claim 2, wherein said selecting portion comprises:

a first register outputting a signal $z_{k-1}$ delayed by one clock pulse from the output $z_k$ of said equalizer;

a subtractor subtracting $z_{k-1}$ from $z_k$;

a first adder adding $z_{k-1}$ and $z_k$;

second and third registers respectively outputting output by said subtractor and said adder;

first and second multipliers respectively inverting the outputs of said second and third registers; and a first multiplexer selecting the outputs of said second and third registers and the outputs of said first and second multipliers according to the output of said conditioning portion and outputting the phase error $Δτ_k$.

11. The data detection apparatus as claimed in claim 10, wherein said error correcting portion comprises:

a third multiplier multiplying a coefficient β by the phase error $Δτ_k$ output by said selecting portion;

a fourth multiplier multiplying a coefficient α by the phase error $Δτ_k$ output by said selecting portion;

a fourth register outputting $Δτ_k$ delayed by one clock pulse in response to a write enable signal output by said conditioning portion and receiving $Δτ_{k+1}$ as an input;

a second adder adding the output of said third multiplier and the output of said fourth register;

a third adder adding the output of said fourth multiplier and the output of said fourth register; and a second multiplexer selectively outputting the output of said fourth register and that of said third adder as the timing error, in response to the write enable signal output by said conditioning portion.

12. A data detection method using a data detection apparatus which comprises an analog/digital converter outputting a symbol signal $r_k$ by sampling a run length limited coded analog signal r(t) at a constant time period k with a sampling clock, an equalizer outputting $z_k$ by equalizing the output $r_k$ of said analog/digital converter, a data detector detecting a symbol $â_k$ from the equalized output $z_k$, and a clock recovering portion correcting frequency and phase of the sampling clock, comprising:

determining a control signal using the symbol data $â_k$ as an input;

calculating a phase error $Δτ_k$ using the equalized output $z_k$ and the control signal; and calculating a timing error using the control signal and the phase error $Δτ_k$.

13. The data detection method as claimed in claim 12, wherein the phase error $Δτ_k$ is determined as $(z_k+z_{k-1})â_k$ when $â_k≠â_{k-1}$, and $-(z_k-z_{k-1})â_k$ when $â_{k+1}=â_{k-2}$, $â_k=â_{k-1}$, and $â_{k-2}≠â_{k-1}$.

14. The data detection apparatus as claimed in claim 2, wherein said conditioning portion comprises:

first, second, and third delaying devices respectively outputting signals $â_{k-1}$, $â_{k-2}$, and $â_{k-3}$ delayed by one clock pulse, two clock pulses, and three clock pulses from the symbol data $â_k$ from said data detector;

an inverter inverting the signal $â_{k-2}$ output by said second delaying device;

an exclusive OR gate outputting '1' when $â_{k-1}$ from said first delaying device and $â_{k-2}$ from said second delaying device are not identical, and outputting '0' when they are identical;

an AND gate outputting '1' when $â_k=â_{k-3}=-â_{k-2}$ and outputting '0' otherwise, in response to the symbol data $â_k$ from said data detector, $â_{k-3}$ from said third delaying device, and $-â_{k-2}$ from said inverter; and an OR gate outputting '1' when $â_{k-1}=â_{k-2}$ or $â_k=â_{k-3}=-â_{k-2}$ and outputting '0' otherwise, in response to the output of said exclusive OR gate and the output of said AND gate.

15. The data detection apparatus as claimed in claim 14, wherein said selecting portion comprises:

a first register outputting a signal $z_{k-1}$ delayed by one clock pulse from the output $z_k$ of said equalizer;

a subtractor subtracting $z_{k-1}$ from $z_k$;

a first adder adding $z_{k-1}$ and $z_k$;

a first multiplexer selecting the outputs of said subtractor and first adder in response to the output of said first delaying device;

first and second multipliers respectively inverting outputs of said first multiplexer; and a second multiplexer selecting the outputs of said first multiplexer and the outputs of said first and second multipliers according to the output of said AND gate and the output of said first delaying device of said conditioning portion and outputting the phase error $\Delta\tau_k$.

16. The data detection apparatus as claimed in claim 15, wherein said error correcting portion comprises:

a third multiplier multiplying a coefficient $\beta$ by the phase error $\Delta\tau_k$ output by said selecting portion;

a fourth multiplier multiplying a coefficient $\alpha$ by the phase error $\Delta\tau_k$ output by said selecting portion;

a second register outputting $\Delta\tau_k$ delayed by one clock pulse in response to a write enable signal output by said OR gate of said conditioning portion and receiving $\Delta\tau_{k+1}$ as an input;

a second adder adding the output of said third multiplier and the output of said second register;

a third adder adding the output of said fourth multiplier and the output of said second register; and a third multiplexer selectively outputting the output of said fourth register and that of said third adder as the timing error, in response to the write enable signal output by said OR gate of said conditioning portion.

* * * * *